US006777263B1

(12) United States Patent
Gan et al.

(10) Patent No.: US 6,777,263 B1
(45) Date of Patent: Aug. 17, 2004

(54) FILM DEPOSITION TO ENHANCE SEALING YIELD OF MICROCAP WAFER-LEVEL PACKAGE WITH VIAS

(75) Inventors: Qing Gan, Fremont, CA (US); Richard C. Ruby, Menlo Park, CA (US); Frank S. Geefay, Cupertino, CA (US); Andrew T. Barfknecht, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/647,040

(22) Filed: Aug. 21, 2003

(51) Int. Cl.[7] .............................................. H01L 21/44
(52) U.S. Cl. ....................... 438/106; 438/640; 438/455; 438/612; 438/107; 438/123; 257/704; 257/417; 257/457; 257/678
(58) Field of Search ................................ 438/106, 640, 438/455, 612, 107, 123; 257/704, 417, 457, 678

(56) References Cited

U.S. PATENT DOCUMENTS

| | | | |
|---|---|---|---|
| 6,228,675 B1 | 5/2001 | Ruby et al. | |
| 6,265,246 B1 | 7/2001 | Ruby et al. | |
| 6,376,280 B1 | 4/2002 | Ruby et al. | |
| 6,429,511 B2 | 8/2002 | Ruby et al. | |
| 6,479,320 B1 * | 11/2002 | Gooch | 438/109 |
| 6,635,509 B1 * | 10/2003 | Ouellet | 438/106 |
| 2002/0179986 A1 * | 12/2002 | Orcutt et al. | 257/417 |
| 2003/0214007 A1 * | 11/2003 | Tao et al. | 257/458 |
| 2003/0230798 A1 * | 12/2003 | Lin et al. | 257/704 |
| 2004/0012838 A1 * | 1/2004 | Huibers | 359/291 |

OTHER PUBLICATIONS

US patent application Publication No. US 2003/0116825 A1, Publication Date: Jun. 26, 2003.
U.S. patent application Publication No. US 2003/0119308 A1, Publication Date: Jun. 26, 2003.
Patent application Ser. No. 10/277,479, filed Oct. 22, 2002, entitled: "Method For Sealing A Semiconductor Device And Apparatus Embodying The Method", Inventor: Frank S. Geefay, 15 pages.
Patent application Ser. No. 10/286,729, filed Nov. 1, 2002, entitled: "Die Singulation Using Deep Silicon Etching", Inventors: Richard C. Ruby et al. , 20 pages.

* cited by examiner

Primary Examiner—Matthew Smith
Assistant Examiner—Victor V Yevsikov

(57) ABSTRACT

A method for forming a wafer package includes forming a die structure, wherein the die structure includes a first wafer, a device mounted on the first wafer, a second wafer mounted atop the first wafer with a first seal ring around the device and a second seal ring around a via contact. The method further includes forming a trench in the second wafer around the first seal ring, filling the trench and the via contact with a sealing agent, patterning a topside of the second wafer to removed the excessive sealing agent and to expose a contact pad of the via contact, and singulating a die around the first seal ring.

8 Claims, 5 Drawing Sheets

FILM DEPOSITION TO ENHANCE SEALING YIELD OF MICROCAP WAFER-LEVEL PACKAGE WITH VIAS

FIELD OF INVENTION

This invention relates to a wafer-level hermetic package for a micro device.

DESCRIPTION OF RELATED ART

A micro-size cap ("microcap") wafer-level package is formed by bonding a cap wafer to a device wafer. The bonding areas are seal rings formed around each die and vias for receiving via contacts or plugs. Due to leaks from defects or contamination in the bonding areas, a packaged device may fail quality and reliability tests where it is exposed to high temperature and humidity. Thus, what is needed is a method to enhance the seal to increase the final product yield.

SUMMARY

In one embodiment of the invention, a method for forming a wafer package includes forming a die structure, wherein the die structure includes a first wafer, a device mounted on the first wafer, a second wafer mounted atop the first wafer with a first seal ring around the device and a second seal ring around a via contact. The method further includes forming a trench in the second wafer around the first seal ring, filling the trench and the via contact with a sealing agent, patterning a topside of the second wafer to remove the excessive sealing agent and to expose a contact pad of the via contact, and singulating a die around the first seal ring.

DETAILED DESCRIPTION

Figure 1:
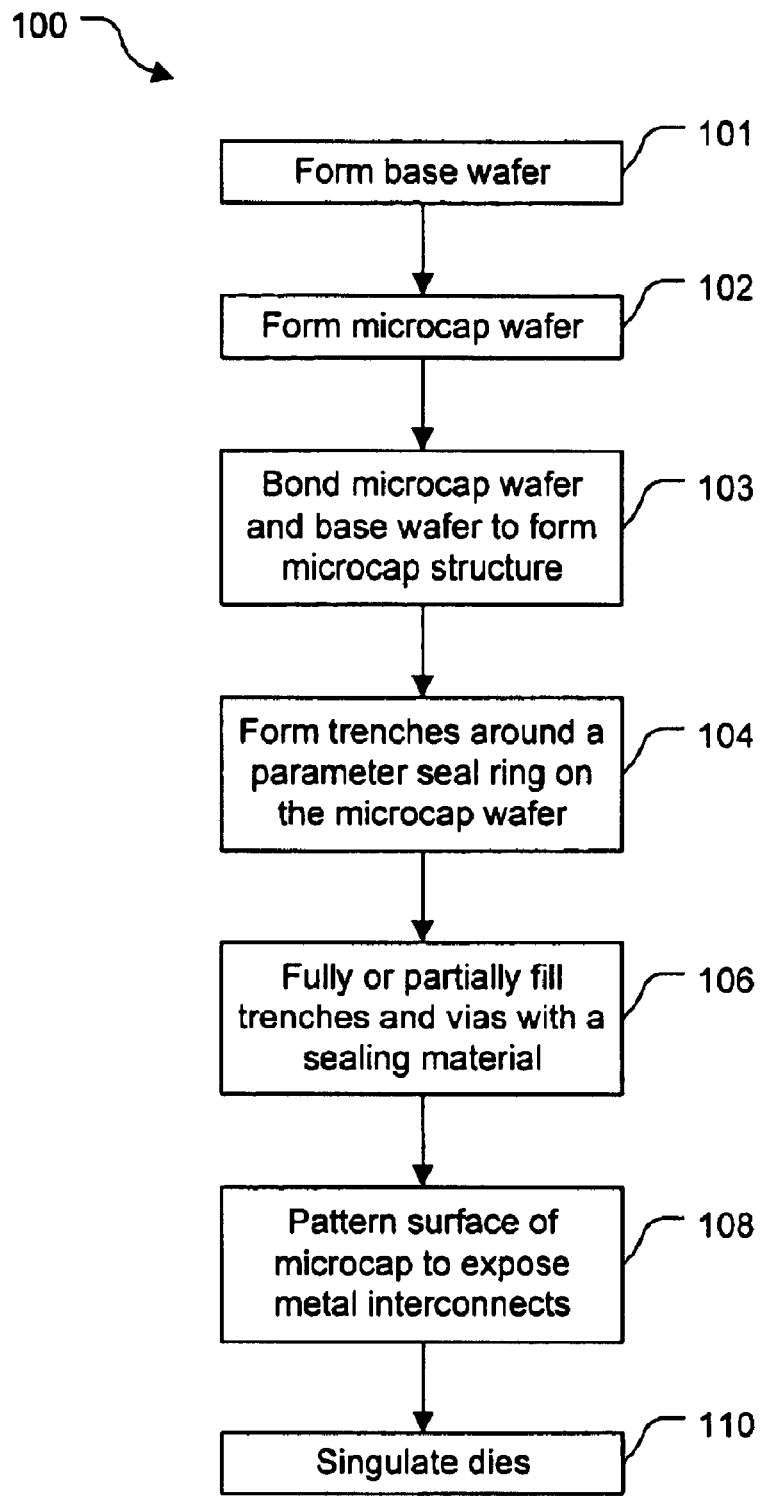
FIG. 1 is a flowchart of a method for forming a microcap wafer-level package in one embodiment of the invention.
Figure 2A:
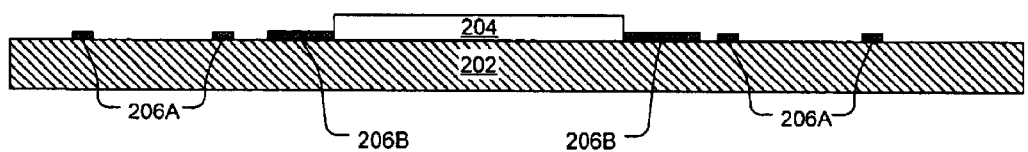
FIGS. 2A, 2B, 2C, 3, 4, 5, and 6 illustrate cross-sections of the structures formed by the method of FIG. 1 in one embodiment of the invention.

FIG. 1 is a flow chart of a method 100 for forming a micro-size cap ("microcap") wafer-level package in one embodiment of the invention. In step 101, a base wafer 202 is formed as shown in FIG. 2A. Base wafer 202 includes a device 204 that needs to be hermetically sealed. Base wafer 202 is typically silicon. Device 204 may be an active circuit, a passive sensor, a MEMS (micro electromechanical system) device, or another similar component. A metal layer is deposited on base wafer 202 and patterned with a photoresist layer to form bonding/contact pads 206A and 206B where required. Bonding pads 206 are typically gold. Device 204 can be connected to pads 206B by bond wires or by metal interconnects in base wafer 202.

Figure 2B:
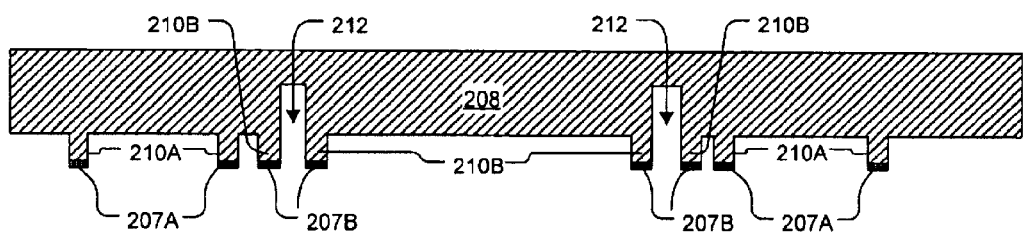

In step 102, a microcap wafer 208 is formed as shown in FIG. 2B. A metal layer is deposited on microcap wafer 208 and patterned with a photoresist layer to form bonding pads 207A and 207B where required. The photoresist layer is then used as a mask to etch silicon gaskets 210A and 210B. Gaskets 210A form a perimeter seal ring 211A (FIG. 7) around device 204 while gaskets 210B form via seal rings 211B (FIG. 7) around locations where vias are to be formed. Gaskets 210A and 210B may include a treaded surface and bonding pads 207A and 207B are typically gold. Another photoresist layer is applied and patterned so vias 212 can be etched where via contacts and plugs are to be formed. In an alternative embodiment described later, vias 212 are etched after microcap wafer 208 is bonded to base wafer 202.

Figure 2C:
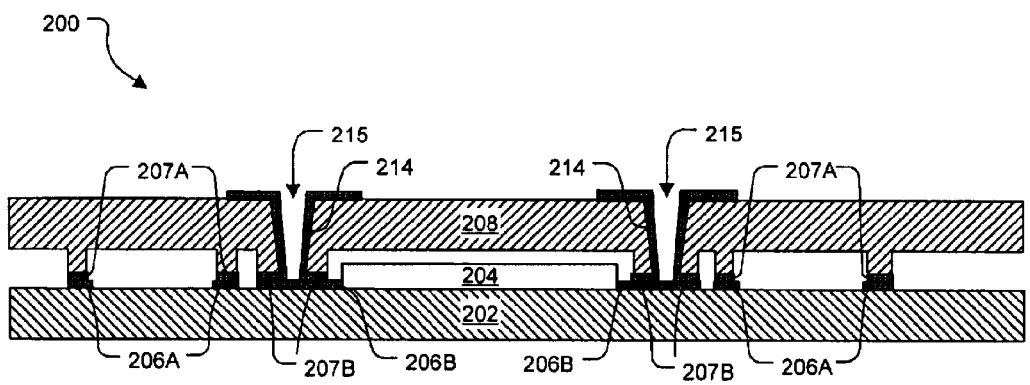

In step 103, base wafer 202 and microcap wafer 208 are aligned and bonded to form a microcap die structure 200 as shown in FIG. 2C. In one embodiment, the wafers are bonded by being compressed together until a cold weld bond forms between pads 206A and 207A, and pads 206B and 207B. Typical bonding conditions for such an embodiment may be compressing the wafers together between 60 to 120 megapascal at temperatures ranging from 320° to 400° C. for 2 minutes to 1 hour. In other embodiments, the wafers might be bonded together by a solder joint, by adhesive, or by glass. In subsequent figures after the bonding, each pair of corresponding pads is shown as one integrated pad.

Microcap wafer 208 is then thinned to expose vias 212 and provide access to contact pads 206B on base wafer 202. Vias 212 can be optionally widened by an isotropic plasma etch. As the front of via 212 is exposed to more etchant and is etched more rapidly than the back, a sloped via 212 that is wider at the front and narrower at the back is formed. A seed metallization layer is deposited on microcap wafer 208 and sidewalls of vias 212 and patterned with a photoresist layer so via contacts 214 can be formed by electroplating. Via contacts 214 are typically gold. As via contacts 214 are formed by electroplating, they define cavities 215 that may be vulnerable to moisture.

Figure 3:
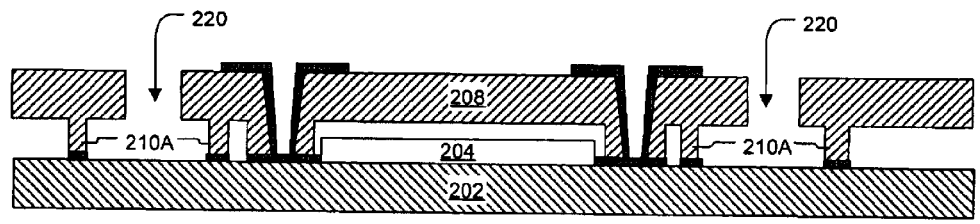
Figure 7:
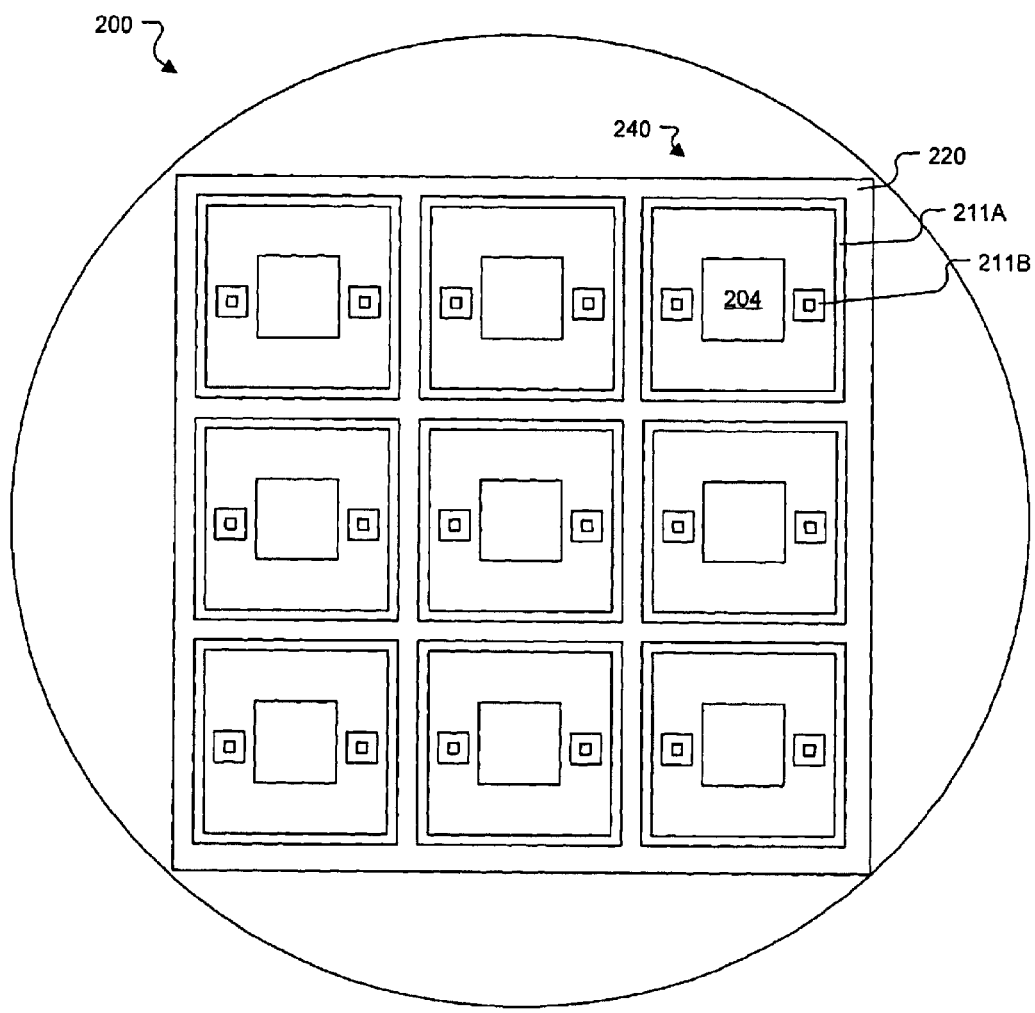
FIG. 7 illustrates a top view of a structure formed by the method of FIG. 1 in one embodiment of the invention.

In step 104, trenches 220 on microcap wafer 208 are formed around gaskets 210A/perimeter seal rings 211A as shown in FIGS. 3 and 7. In one embodiment, DRIE (deep reactive ion etching) is used to form trenches 220. Alternatively, a saw can be used to form trenches 220.

Figure 4:
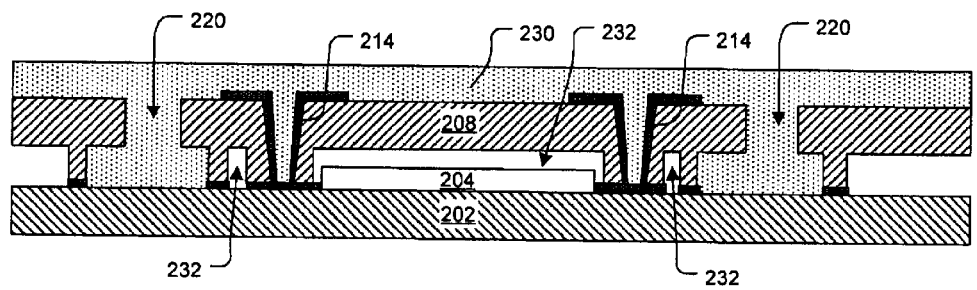

In step 106, trenches 220 and via contacts 214 are partially or fully filled with a sealing agent 230 as shown in FIG. 4. Sealing agent 230 is a coating that inhibits moisture from entering volumes 232. Examples of sealing agent 230 include photoresist, polyimide, B-staged bisbenzocyclobutene (BCB), other polymers, spin-on-glass, glass, Pyrex® (from Corning of New York), oxide, nitride, or metals. Spin-on-glasses can be spun onto microcap wafer 208 to fill trenches 220 and via contacts 214. Glasses and other dielectric materials can fill trenches 220 and via contacts 214 by sol-gel processes. Screen printing of polymers such as epoxy, photoresist, polyimide, and BCB can also be used for filling. Pyrex, oxide, nitrides, and other dielectrics can be coated on trenches 220 and via contacts 214 by evaporation, sputtering, or vapor deposition. Metals might be deposited by evaporation, sputtering, electroplating or electroless plating. Alternatively, a polymer can be used to fill via contacts 214 and trenches 220 and then contact pads 214A can be coated with a dielectric or metal thin film 234 (FIG. 5) above filing agent 230 as an additional barrier against moisture. Polymers can fill via contacts 214 and trenches 220 by spin-coating, screen printing, or injection. Film 234 can be one or multiple layers of gold, titanium, aluminum, tungsten, titanium tungsten, chromium, nickel, copper, palladium, platinum or an alloy of any preceding metal.

Figure 5:
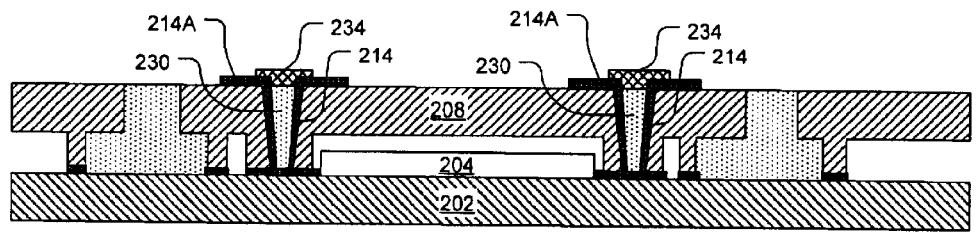

In step 108, the top surface of microcap wafer 208 is patterned to remove excessive sealing agent 230 and to expose contact pads 214A of via contacts 214 as shown in FIG. 5. In one embodiment, the top surface is wet etched to remove sealing agent 230. Alternatively, the top surface can be dry etched to remove sealing agent 230. In another embodiment, the top surface is polished or chemically-mechanically polished to remove excess sealing agent 230.

Figure 6:
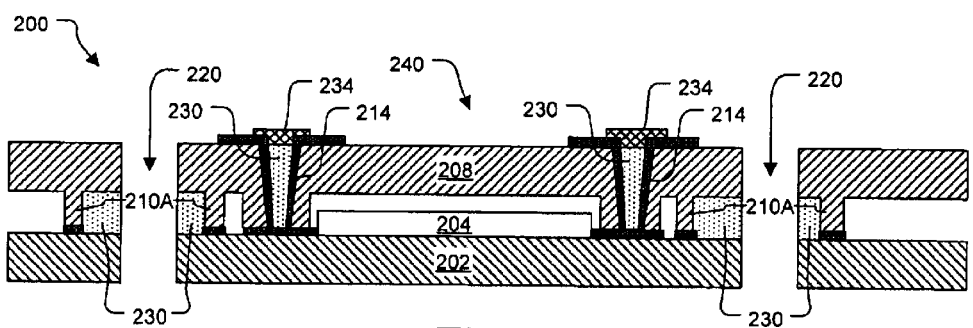

In step 110, a die 240 is singulated from structure 200 along trenches 220 as shown in FIG. 6. In one embodiment, die 240 is singulated with a saw. Alternatively, die 240 can be singualted with a scribe and break tool. As can be seen, sealing agent 230 provides an additional seal around gaskets 210A/perimeter seal rings 211A and an additional seal within via contacts 214 to protect die 240 against moisture and containments.

Figure 8:
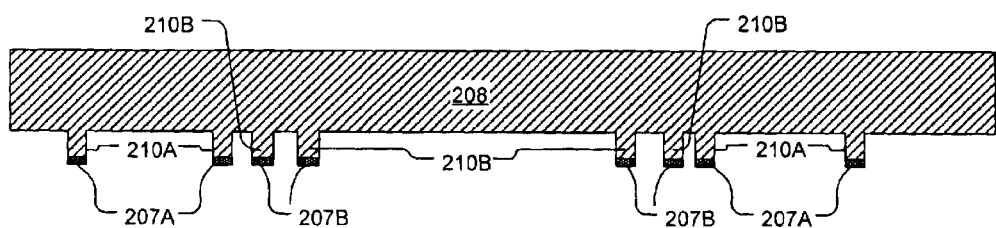
FIGS. 8 and 9 illustrate cross-sections of the structures formed by the method of FIG. 1 in another embodiment of the invention.
Figure 9:
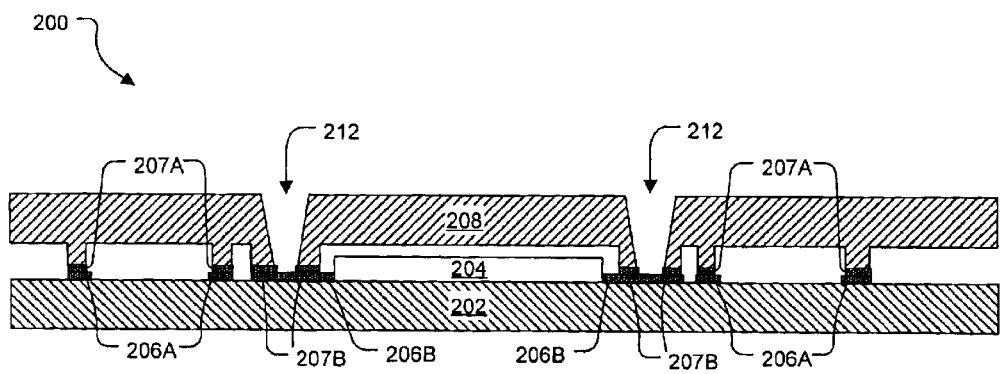

In an alternative embodiment shown in FIGS. 8 and 9, microcap wafer 208 is etched to form vias 212 after microcap wafer 208 is bonded to base wafer 202. Vias 212 can then be plated and filled as described above.

Various other adaptations and combinations of features of the embodiments disclosed are within the scope of the invention. Numerous embodiments are encompassed by the following claims.

What is claimed is:

1. A method for forming a wafer package, comprising:

forming a die structure comprising:

a first wafer;

a device on the base wafer;

a second wafer mounted atop the first wafer with a first seal ring around the device and a second seal ring around a via contact, the via contact defining a via cavity;

forming a trench in the second wafer around the first seal ring;

filling the trench and the via cavity with a sealing agent;

patterning a topside of the second wafer to remove excessive sealing agent and to expose a contact pad of the via contact; and singulating a die around the first seal ring.

2. The method of claim 1, wherein said forming a trench comprises performing a deep reactive ion etch to form the trench.

3. The method of claim 1, wherein said forming a trench comprises using a saw to form the trench.

4. The method of claim 1, wherein said patterning a topside of the second wafer comprises wet etching the sealing agent down to the contact pad.

5. The method of claim 1, wherein said patterning a topside of the second wafer comprises dry etching the sealing agent down to the contact pad.

6. The method of claim 1, wherein said singulating the die comprises sawing the die.

7. The method of claim 1, wherein the sealing agent is selected from the group consisting a photoresist, a polyimide, a B-staged bisbenzocyclobutene (BCB), a spin-on-glass, a glass, a pyrex, an oxide, and a nitride.

8. The method of claim 1, wherein the sealing agent is a polymer, the method further comprising depositing on the contact pad a thin film selected from the group consisting of a metal and a dielectric.

* * * * *